United States Patent
Mayo et al.

(10) Patent No.: US 9,618,564 B2
(45) Date of Patent: Apr. 11, 2017

(54) PRINTED CIRCUITS WITH SACRIFICIAL TEST STRUCTURES

(71) Applicant: Apple Inc., Cupertino, CA (US)

(72) Inventors: Sean A. Mayo, Mountain View, CA (US); Shankar S. Pennathur, San Jose, CA (US)

(73) Assignee: Apple Inc., Cupertino, CA (US)

( * ) Notice: Subject to any disclaimer, the term of this patent is extended or adjusted under 35 U.S.C. 154(b) by 458 days.

(21) Appl. No.: 14/164,769

(22) Filed: Jan. 27, 2014

(65) Prior Publication Data
US 2015/0212114 A1   Jul. 30, 2015

(51) Int. Cl.
  *B05D 1/02*   (2006.01)
  *B05D 1/28*   (2006.01)
  *G01R 31/28*  (2006.01)
  *H05K 1/02*   (2006.01)
  *H05K 1/14*   (2006.01)

(52) U.S. Cl.
CPC ....... *G01R 31/2818* (2013.01); *H05K 1/0268* (2013.01); *H05K 1/147* (2013.01); *H05K 2201/09036* (2013.01); *H05K 2201/09163* (2013.01)

(58) Field of Classification Search
CPC ... B05D 1/02; B05D 1/18; B05D 1/28; B05D 3/06; B05D 5/00; H05K 1/181; H05K 1/115; H05K 1/0298; G01N 27/048; G01N 27/20; G01N 27/04
USPC ............ 324/757.02, 763.01, 750.26, 762.01, 324/762.05, 719, 71.5, 765, 437, 760.02, 324/445–446, 754.07, 755.01, 765.03, 324/758.01, 750.16, 690–696, 724
See application file for complete search history.

(56) References Cited

U.S. PATENT DOCUMENTS

| | | | |
|---|---|---|---|
| 4,922,190 A | * | 5/1990 | Reinholz ................ H01R 31/06 324/756.05 |
| 5,315,241 A | | 5/1994 | Ewers |
| 6,030,254 A | | 2/2000 | Johnson et al. |
| 6,124,716 A | | 9/2000 | Kanamori |

(Continued)

FOREIGN PATENT DOCUMENTS

WO   2013163210   10/2013

OTHER PUBLICATIONS

Foster et al., U.S. Appl. No. 13/488,382, filed Jun. 4, 2012.

*Primary Examiner* — Patrick Assouad
*Assistant Examiner* — Taqi Nasir
(74) *Attorney, Agent, or Firm* — Treyz Law Group, P.C.; G. Victor Treyz; Joseph F. Guihan

(57) ABSTRACT

Electrical components may be soldered to a printed circuit. The printed circuit may have an edge with an opening. Printed circuit contacts in the opening may be configured to form electrical connections with mating contacts on a flexible printed circuit or other external structure. A tester may test the electrical components by conveying signals through the contacts. Following testing, the external structure may be removed from the opening. The opening may then be filled with dielectric to isolate the printed circuit contacts. A printed circuit may have traces that extend under a ground on a surface of the printed circuit, may have edge test points formed from contacts that are cut in half when removing portions of the printed circuit, or may have through-mold vias that are formed through encapsulant over the electrical components.

19 Claims, 18 Drawing Sheets

(56) References Cited

U.S. PATENT DOCUMENTS

| | | |
|---|---|---|
| 7,863,918 B2 | 1/2011 | Jenkins et al. |
| 8,058,888 B2 | 11/2011 | Wu |
| 8,536,875 B2 | 9/2013 | Ogle et al. |
| 2006/0006892 A1 | 1/2006 | Green et al. |
| 2008/0048639 A1* | 2/2008 | Sutono .............. G01R 1/06772 324/76.19 |
| 2008/0233769 A1* | 9/2008 | Grover .............. G01R 31/2889 439/55 |
| 2012/0052697 A1* | 3/2012 | Yu ...................... H01R 12/725 439/55 |
| 2012/0320558 A1* | 12/2012 | Foster ................. H05K 1/0218 361/818 |
| 2013/0257659 A1* | 10/2013 | Darnell ................ H01Q 1/243 343/702 |

\* cited by examiner

PRINTED CIRCUITS WITH SACRIFICIAL TEST STRUCTURES

BACKGROUND

This relates generally to testing and, more particularly, to test structures for testing electrical components.

Electronic devices include electrical components mounted on printed circuit boards. Shield layers are sometimes formed over the components to reduce electromagnetic signal interference. During manufacturing, it may be necessary to perform tests on electrical components. For example, it may be desirable to probe test points on a printed circuit board after electrical components have been mounted on the printed circuit board. If a faulty component is detected, the printed circuit board may be scrapped or repaired.

To minimize printed circuit board size, some printed circuit board designs include regions with test pad that are machined away after testing. If care is not taken, the structures used for implementing the test pads on a printed circuit board may add undesirable bulk or may be incompatible with electromagnetic interference shielding structures.

It would therefore be desirable to be able to provide improved testing structures for electrical components mounted on printed circuits.

SUMMARY

Printed circuits may be provided with structures such as test pads that facilitate testing. To ensure that the printed circuits are not overly large, the test pads may be removed from a printed circuit following testing or may otherwise be implemented without consuming excessive space on the printed circuit.

A printed circuit may be formed from a dielectric substrate with metal traces. The dielectric substrate may include rigid printed circuit board layers and/or flexible layers of printed circuit material. A printed circuit may, for example, be implemented using an embedded flex printed circuit configuration having a rigid printed circuit board portion with a removable flexible printed circuit tail portion.

Electrical components may be soldered to the printed circuit. The printed circuit may have an edge with an opening. Contacts in the opening may be configured to form electrical connections with mating contacts on a flexible printed circuit or other external structure. A tester may test the electrical components by forming electrical connections with the contacts in the opening and other metal traces in the printed circuit through the mating contacts on the external structure.

Following testing, the external structure that is used by the tester to form electrical connections with the contacts on the printed circuit may be removed from the opening. The opening may then be filled with dielectric to isolate the contacts.

If desired, a printed circuit may have traces that extend under a ground formed on a surface of the printed circuit adjacent to an encapsulation layer, may have edge test points formed form contacts that are cut in half when removing portions of the printed circuit, may have through-mold vias that are formed through encapsulant covering the electrical components, or may have other configurations.

DETAILED DESCRIPTION

Figure 1:
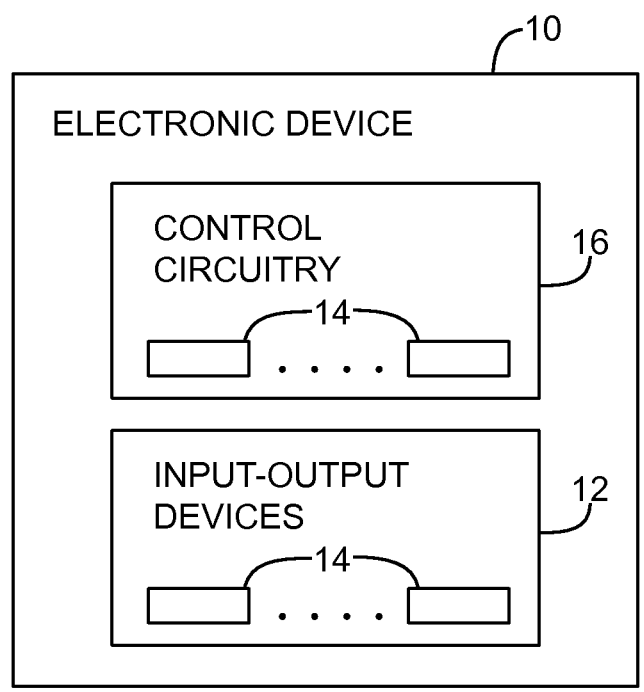
FIG. 1 is a diagram of an illustrative electronic device of the type that may be provided with components that have been tested in accordance with an embodiment.

Electronic devices may be provided with electrical components mounted on printed circuits. An illustrative electronic device of the type that may include components on printed circuits is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio codec chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, click wheels, scrolling wheels, touch pads, key pads, keyboards, microphones, speakers, tone generators, vibrators, cameras, sensors, light-emitting diodes and other status indicators, data ports, displays, etc. A user can control the operation of device 10 by supplying commands through input-output devices 12 and may receive status information and other output from device 10 using the output resources of input-output devices 12.

Control circuitry 16 and input-output devices 12 may include one or more electrical components 14. Components 14 may include integrated circuits, surface mount technology (SMT) parts, discrete components such as inductors, capacitors, and resistors, electronic components such as switches, sensors, connectors, audio components, light-emitting components, or other devices.

Components 14 may be mounted on one or more printed circuits. To ensure that the components are operating properly, tests may be performed on the components.

Figure 2:
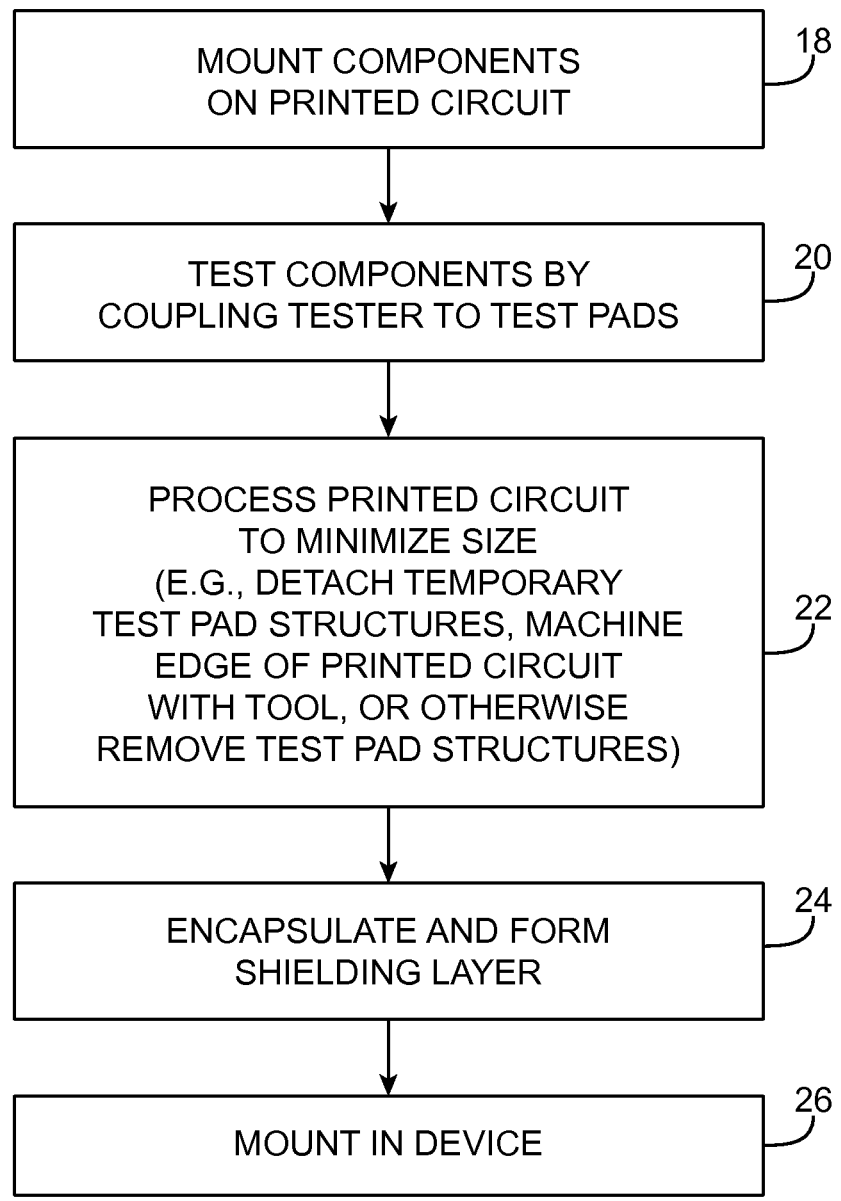
FIG. 2 is a flow chart of illustrative steps involved in mounting and testing components in accordance with an embodiment.

A flow chart showing how components such as components 14 may be tested during manufacturing is shown in FIG. 2.

At step 18, electrical components 14 may be mounted on a printed circuit. For example, conductive material such as conductive adhesive or solder may be used in coupling contacts on a component to mating contacts (e.g., metal traces in the shape of pads) on the printed circuit.

At step 20, the components may be tested. A tester may use test pins and other structures to form electrical connections to the printed circuit. The printed circuit may have, for example, test pads that may be contacted by respective test pins in a tester. If a defect is detected during testing, the printed circuit board can be scrapped or reworked (e.g., to replace a faulty component, etc.).

If the printed circuit and the electrical components on the printed circuit are determined to be operating satisfactorily during the test of step 20, the printed circuit can be processed at step 22.

During the operations of step 22, the printed circuit can be reconfigured to minimize its size. For example, the size of the printed circuit can be reduced by removing sacrificial test structures from the printed circuit. The sacrificial test structures may include test signal paths (e.g., test contacts such as test pads, associated signal lines for coupling the test pads to circuitry in the electrical components, etc.). Portions of the printed circuit such as a printed circuit portion having test pads can be removed using machining equipment or other tools, a removable structure such as a detachable strip of flexible printed circuit material with test pads may be detached from the printed circuit, or other structures with test pads may be removed from the printed circuit to reduce the size of the printed circuit. Because the test pads may be removed before use of the printed circuit in a system, the size and spacing of the test pads (e.g., test pad pitch) may generally be larger than the size and spacing of corresponding test structures in the printed circuit.

Following the operations of step 22, a dielectric material may be used to encapsulate the components on the printed circuit. For example, components 14 and some or all of the printed circuit may be covered with a polymer encapsulant (e.g., a thermoset plastic or a thermoplastic). The encapsulated components may then be covered with electromagnetic interference shielding. For example, one or more layers of metal or other conductive coatings may be formed on the polymer that is encapsulating components 14. By covering the polymer encapsulant that surrounds components 14 with a conductive metal shield layer, components 14 may be electromagnetically shielded.

Figure 3:
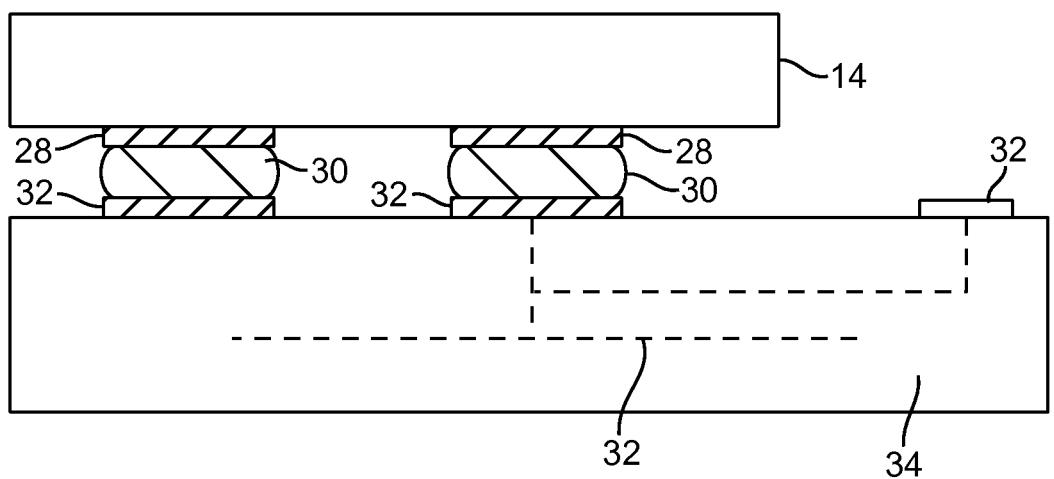
FIG. 3 is a cross-sectional side view of an illustrative component mounted on a printed circuit board in accordance with an embodiment.

FIG. 3 is a cross-sectional side view of an illustrative component mounted to a printed circuit. As shown in FIG. 3, component 14 may have metal traces (pads) that form component contacts 28 and printed circuit 34 may have metal traces 32 (e.g., surface pads and embedded traces such as vias, etc.) that form corresponding printed circuit contacts. Solder 30 may be used to solder component contacts 28 to printed circuit contacts 32 on the surface of printed circuit 34.

Figure 4:
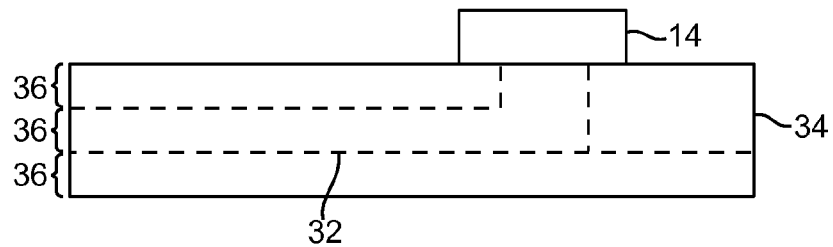
FIG. 4 is a cross-sectional side view of an illustrative rigid printed circuit board in accordance with an embodiment.

As shown in FIG. 4, printed circuit 34 may contain multiple layers 36. Each layer 36 may have a layer of dielectric (e.g., a polymer layer) and an associated layer of patterned metal traces 32 that form signal lines. Traces 32 such as vias that extend vertically through one or more of layers 36 may be used to interconnect signal lines on different respective layers. Components such as component 14 of FIG. 4 may be soldered to the surface of printed circuit 34, as described in connection with FIG. 3. Printed circuit 34 may have one dielectric layer 36, two dielectric layers 36, three dielectric layers 36, or four or more dielectric layers 36 and a corresponding number of layers of signal lines formed from traces 32.

Figure 5:
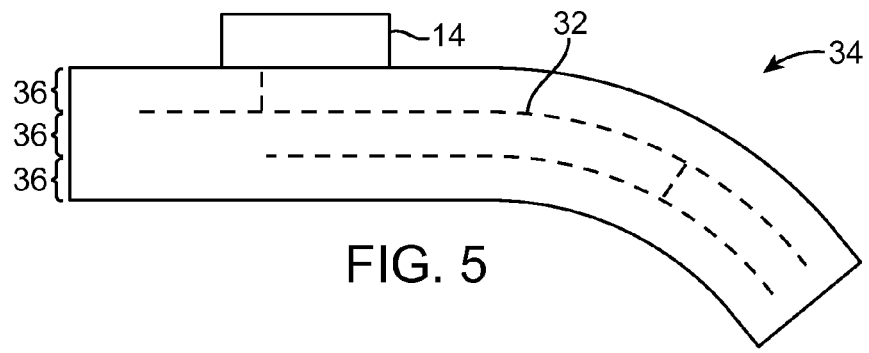
FIG. 5 is a cross-sectional side view of an illustrative flexible printed circuit in accordance with an embodiment.
Figure 6:
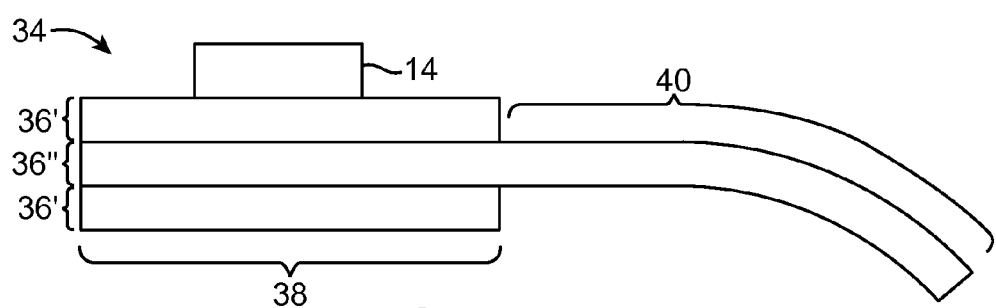
FIG. 6 is a cross-sectional side view of an illustrative "rigid flex" printed circuit in accordance with an embodiment.

In the example of FIG. 4, printed circuit 34 is a rigid printed circuit board (e.g., a printed circuit formed from a rigid dielectric substrate material such as fiberglass-filled epoxy). As shown in FIG. 5, printed circuit 34 may be a flexible printed circuit (e.g., a printed circuit formed from a flexible polymer substrate such as a layer of polyimide or a sheet of other flexible polymer material). The illustrative configuration of flexible printed circuit 34 of FIG. 6 shows how printed circuit 34 may be implemented using "rigid flex" printed circuit material. In a "rigid flex" printed circuit, part of the printed circuit (e.g., portion 38 in the example of FIG. 6) has rigid printed circuit board layers 36' and at least one flexible printed circuit layer 36", whereas another portion of the rigid flex printed circuit (e.g., flexible tail portion 40 in the example of FIG. 6) has only the flexible printed circuit layer(s) 36". Components such as component 14 may be mounted in region 38 and/or in flexible tail region 40. Rigid layers 36' may be formed from a material such as fiberglass-filled epoxy. Flexible layer 36" may be formed from one or more layers of polyimide or other sheets of flexible polymer. Layers 36' and 36" may be used to support signal lines formed from patterned metal traces 32 (see, e.g., FIG. 3).

Figure 7:
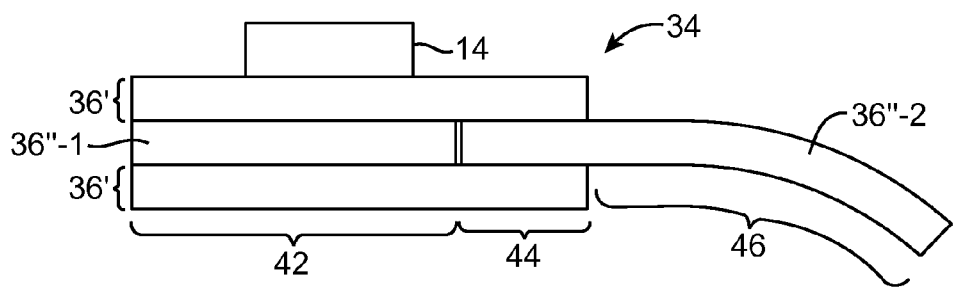
FIG. 7 is a cross-sectional side view of an illustrative "embedded flex" printed circuit in accordance with an embodiment.

In the example of FIG. 7, printed circuit 34 is an "embedded flex" printed circuit (sometimes referred to as "e-flex"). As shown in FIG. 7, embedded flex printed circuit 34 may have some regions such as region 42 that include rigid layers 36' stacked with one or more flexible printed circuit layers such as flexible layer 36"-1. Components such as component 14 may be mounted in regions such as region 42 or other portions of printed circuit 34. In regions such as region 46, a flexible printed circuit tail such as flexible printed circuit 36"-2 extends outwards from between layers 36'. In regions such as region 44, an embedded end of flexible printed circuit 36"-2 is sandwiched between layers 36'. Portions 36"-1 and 36"-2 are separate, which allows portion 36"-2 to be pulled out of the rest of printed circuit 34 when it is desired to remove printed circuit portion 36"-2 and therefore help minimize the size of printed circuit 34.

Figure 8:
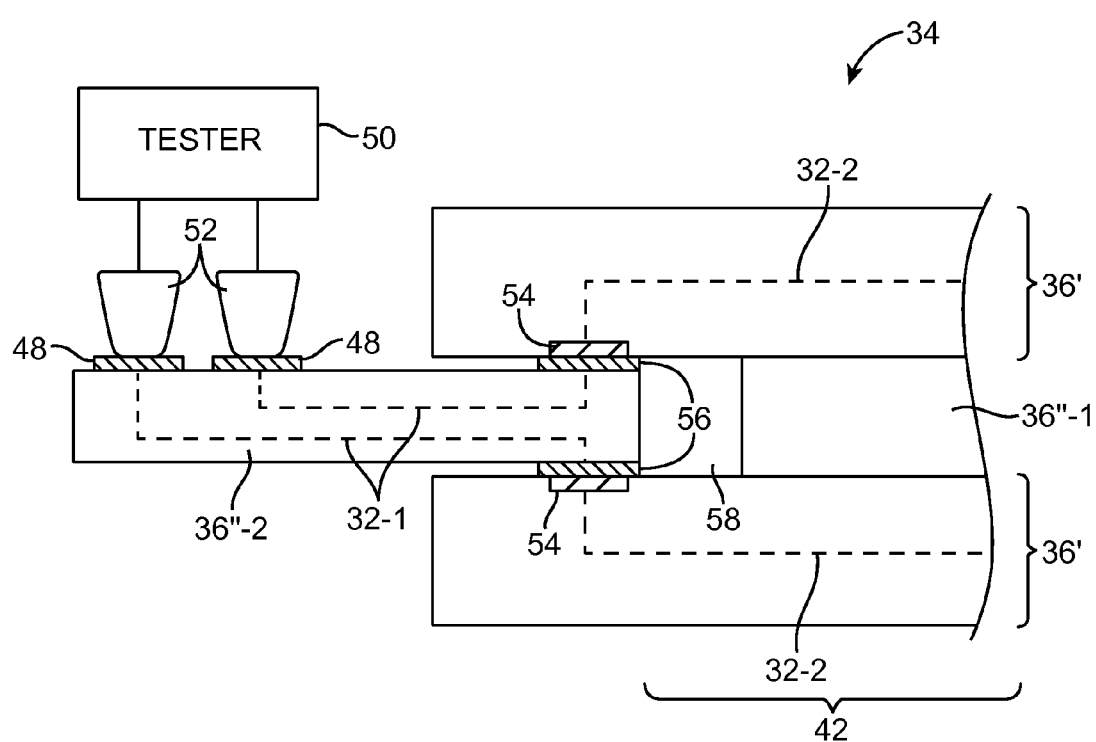
FIG. 8 is a cross-sectional side view of a system in which a removable flexible printed circuit portion of an embedded flex printed circuit is being used to carry test pads in accordance with an embodiment.

The ability to reduce the size of embedded flex printed circuit 34 by removing flexible printed circuit portion 36"-2 from the rest of embedded flex printed circuit 34 can be used to implement sacrificial test structures. As shown in FIG. 8, for example, flexible printed circuit 36"-2 may be provided with test pads such as contacts 48. Flexible printed circuit 36"-2 may have traces 32-1 that form signal lines coupling contacts 48 to contacts 56. Contacts 56, in turn, may mate with corresponding printed circuit contacts 54 on rigid portions of printed circuit 34 such as rigid layers 36'. Contacts 54 may be formed within an opening (gap) such as opening 58 between printed circuit layers such as layers 36'.

Traces 32-2 in rigid layers 36' and/or other layers in printed circuit 34 may be used to couple contacts 54 to components on printed circuit 34 such as component 14 (see, e.g., FIG. 3). In this type of configuration, printed circuit 34 uses traces 32-2 to interconnect components such as component 14 that are mounted on main portion 42 of printed circuit 34 to other components 14 that are mounted on main portion 42 and uses traces 32-2 to interconnect the circuitry of component(s) 14 on printed circuit 34 to contacts 54.

Flexible printed circuit 36"-2 serves as a removable sacrificial test structure. Tester 50 uses pins 52 to form electrical connections with respective contacts (test pads) such as test pads 48. Signal lines 32-1 in flexible printed circuit 36"-2 and contacts 56 are used to electrically connect test pads 48 (and therefore tester 50) to printed circuit contacts 54, signal paths 32-2 and the circuitry of components 14. This allows tester 50 to perform tests on the circuitry of components 14. Once testing is complete, flexible printed circuit 36"-2 may be pulled out of opening 58 in printed circuit 34, thereby disconnecting flexible printed circuit 36"-2 from printed circuit 34. Opening 58 may then be filled with plastic or other dielectric, if desired. Shielding may be formed by coating components 14 with a dielectric and by coating the dielectric over components 14 and the dielectric of printed circuit 34 with a metal coating or other conductive layer.

Figure 9:
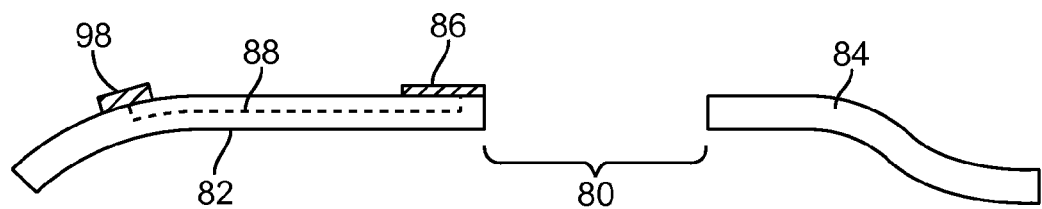
FIG. 9 is a cross-sectional side view of a flexible printed circuit showing how the flexible printed circuit may be provided with an opening during formation of an embedded flex printed circuit in accordance with an embodiment.
Figure 10:
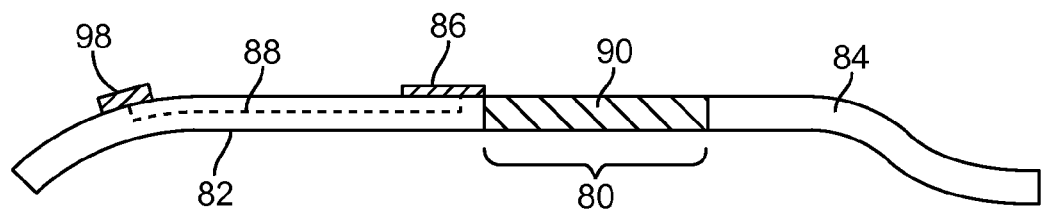
FIG. 10 is a cross-sectional side view of the flexible printed circuit of FIG. 9 following incorporation of rigid dielectric into the opening during formation of an embedded flex printed circuit in accordance with an embodiment.
Figure 11:
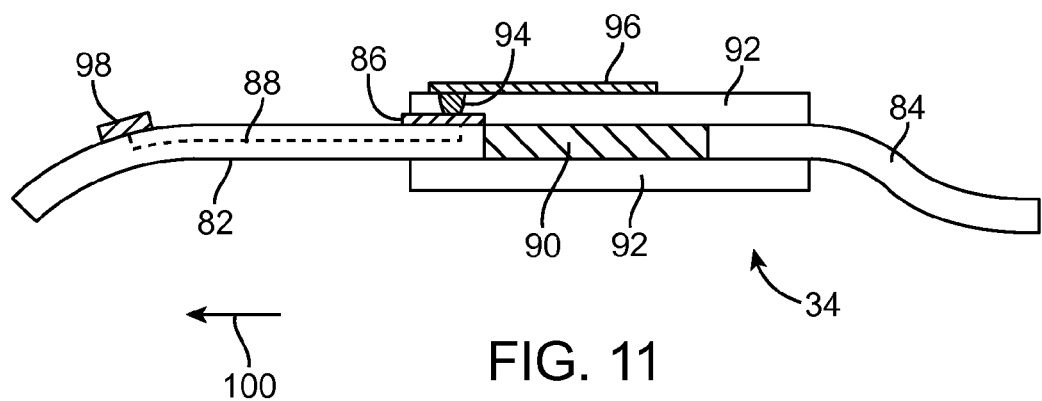
FIG. 11 is a cross-sectional side view of the printed circuit structure of FIG. 10 following the formation of additional rigid dielectric layers and metal traces to form an embedded flex printed circuit in accordance with an embodiment.

FIGS. 9, 10, and 11 illustrate how an embedded flex printed circuit may be formed. Initially, a flexible printed circuit may be formed with an opening such as opening 80 of FIG. 9. As shown in FIG. 9, opening 80 may be formed in portions of a flexible printed circuit such as portions 82 and 84. Traces 88 on the flexible printed circuit (e.g., on circuit portion 82) may be used to couple test pads 98 to contacts 86.

As shown in FIG. 10, dielectric 90 (e.g., rigid printed circuit board material or other dielectric) may be used to fill opening 80.

FIG. 11 shows how dielectric 90 may be sandwiched between opposing upper and lower printed circuit board layers 92 (e.g., rigid printed circuit board layers). Printed circuit portion 84 may protrude from between layers 92 or may be located entirely between layers 92. Via 94 or other conductive structures in printed circuit board material 92 may form a printed circuit contact to connect signal lines 96 (and components 14 that are coupled to lines 96) to mating contact 86 on flexible printed circuit 82. Testing may be performed on the circuitry mounted on printed circuit 34 of FIG. 11. Following testing, flexible printed circuit 82 may be removed from printed circuit 34 in direction 100 as described in connection with flexible printed circuit 36"-2 of FIG. 8.

Figure 12:
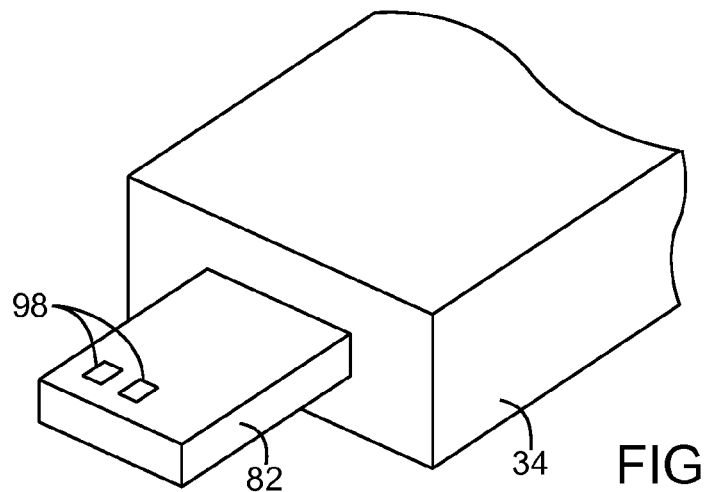
FIG. 12 is a perspective view of an embedded flex printed circuit with a removable flexible printed circuit tail for supporting test pads in accordance with an embodiment.
Figure 13:
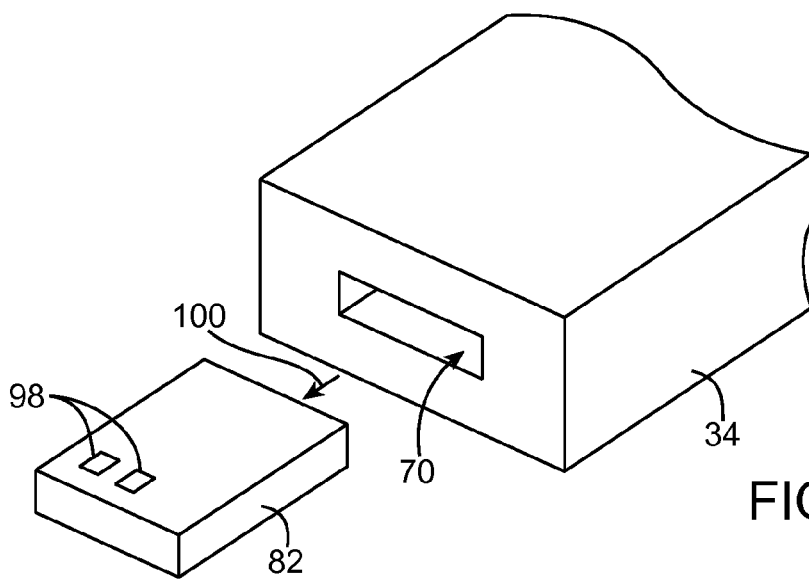
FIG. 13 is a perspective view of the embedded flex printed circuit of FIG. 12 during removable of the tail in accordance with an embodiment.
Figure 14:
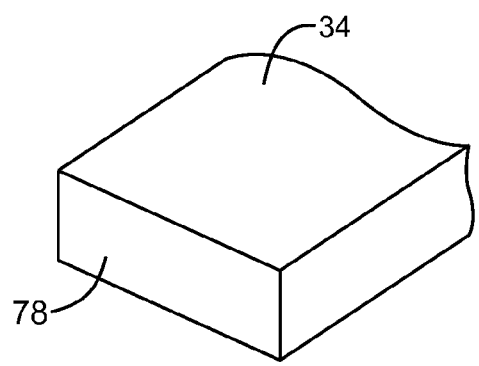
FIG. 14 is a perspective view of the embedded flex printed circuit of FIGS. 12 and 13 following dielectric fill operations in accordance with an embodiment.

FIG. 12 is a perspective view of a printed circuit configuration in which flexible printed circuit portion 82 of FIG. 11 is protruding from printed circuit 34. A tester such as tester 50 of FIG. 8 may use test pins 52 to contact test pads 98 to test components 14 mounted on printed circuit 34, as described in connection with test pads 48 and the structures of FIG. 8. Following testing, flexible printed circuit 82 may be pulled out of printed circuit 34 to form opening 70 in the end of printed circuit 34, as shown in FIG. 13. As shown in FIG. 14, opening 70 may be filled with dielectric. The dielectric in opening 70 closes opening 70 and forms a smooth edge for printed circuit 34 such as end face 78. The plastic or other dielectric in opening 70 insulates contacts within opening 70 such as printed circuit contacts 94 of FIG. 11, so that the printed circuit contacts in opening 70 are not exposed during use of printed circuit 34 in a system.

FIGS. 15, 16, 17, 18, 19, and 20 illustrate how an embedded flex printed circuit may be fabricated and mated with a temporary external test structure for testing. The external structure may be, for example, part of a test system.

Figure 15:
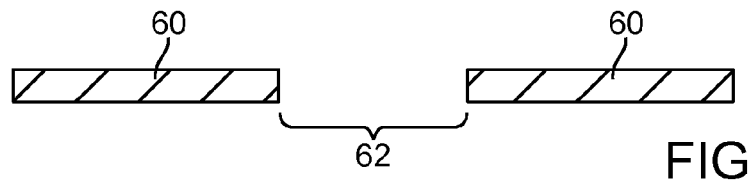
FIGS. 15, 16, 17, 18, 19, and 20 are cross-sectional side views showing how a printed circuit can be configured to facilitate testing in accordance with an embodiment.
Figure 16:
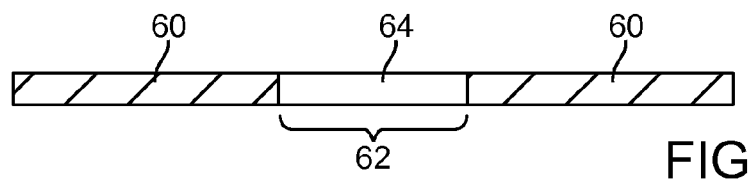
Figure 17:
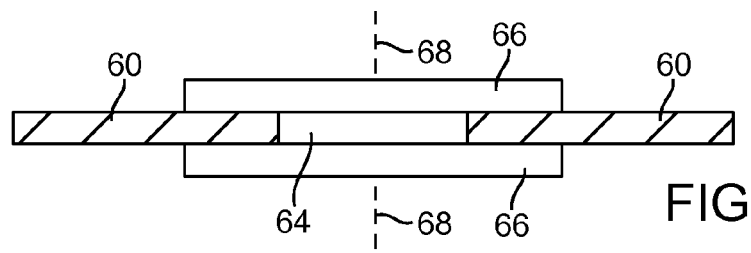

As shown in FIG. 15, a substrate such as printed circuit 60 (e.g., a flexible or rigid printed circuit) may be provided with an opening such as opening 62. Rigid dielectric 64 may be used to fill opening 62, as shown in FIG. 16. After filling opening 62 with dielectric 64, additional printed circuit board layers such as layers 66 (e.g., rigid layers) may be formed on the upper and lower surfaces of printed circuit 60 and dielectric 64, as shown in FIG. 17. After forming the structures of FIG. 17, a cutting tool (e.g., a laser, cutting wheel, or other tool) may be used to cut the structures of FIG. 17 along cut line 68, resulting in the structures of FIG. 18. Dielectric 64 may then be removed (e.g., by pulling dielectric 64 out of printed circuit, by dissolving dielectric 64 using a chemical solution, etc.). With one suitable arrangement, dielectric 64 may be a slippery material such as polytetrafluoroethylene to facilitate removal by pulling. Removal of dielectric 64 forms opening 102 of FIG. 19. Opening 102 may contain printed circuit contacts (see e.g., contacts 54 of FIG. 8). A printed circuit board layer, plastic support structure, or other external structure such as external structure 72 of FIG. 20 may have mating contacts and may have traces that form connections between the mating contacts and testing circuitry within a tester.

During testing, external structure 72 may be inserted into opening 102 in printed circuit 34 in direction 74. The tester can then make contact with the contacts in structure 72 that are coupled to the printed circuit contacts in printed circuit 34 to test circuitry mounted on printed circuit 34 of FIG. 14. Following testing, printed circuit board 72 can be pulled out of printed circuit 34 in direction 76 and opening 102 may be filled with dielectric.

Figure 18:
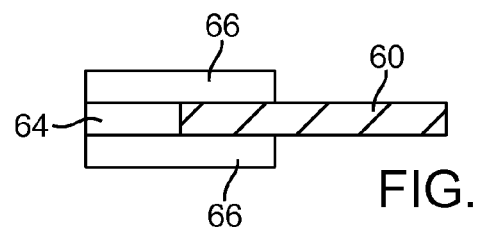
Figure 19:
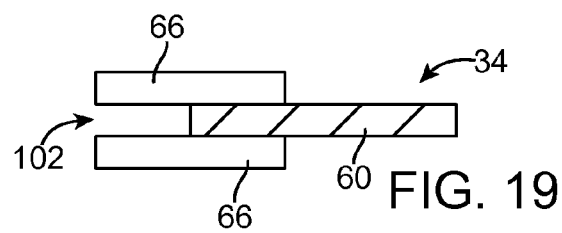
Figure 20:
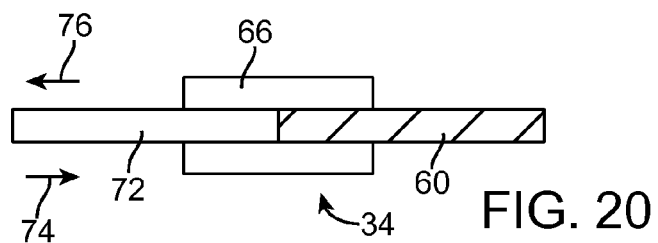
Figure 21:
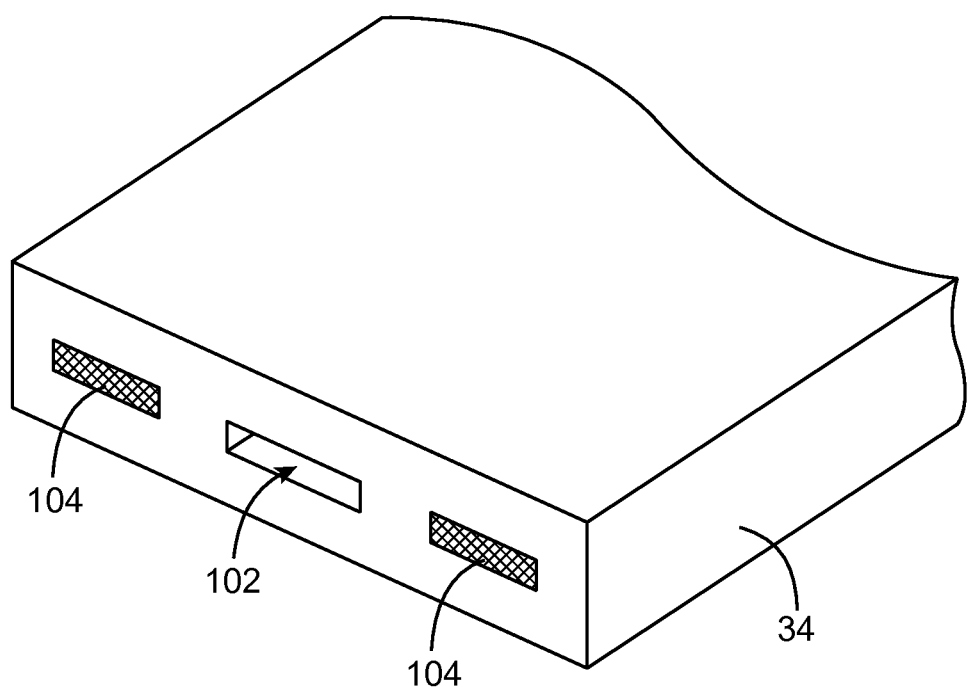
FIG. 21 is a perspective view of an edge of a printed circuit showing how ground traces may be exposed to facilitate the subsequent formation of a grounded shield structure on the printed circuit in accordance with an embodiment.

FIG. 21 is a perspective view of an edge of printed circuit 34 in an illustrative configuration in which a flexible printed circuit portion such as portion 82 of FIG. 11 or a dielectric structure such as dielectric structure 64 of FIG. 18 has been removed from printed circuit 34. As shown in FIG. 21, removal of portion 82 or dielectric structure 64 results in an opening such as opening 102 of FIG. 19. Following testing, opening 102 may be filled with dielectric to insulate contacts within opening 102. Printed circuit 34 may also have exposed traces on the surface of the edge of printed circuit 34 such as traces 104. Traces 104 may be ground traces or other traces that can be shorted to a conductive layer that is deposited to form a shielding layer for components 14 on printed circuit 34 (after components 14 have been encapsulated in dielectric).

Figure 22:
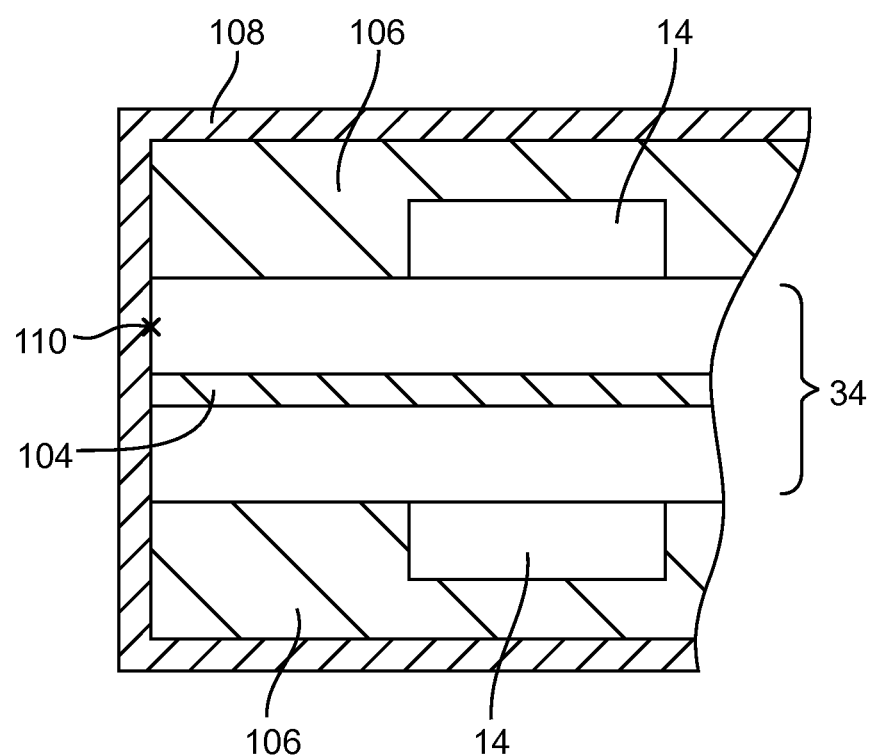
FIG. 22 is a cross-sectional side view of a printed circuit with encapsulated components and a metal interference shield coating in accordance with an embodiment.

FIG. 22 is a cross-sectional side view of a printed circuit with encapsulated components and a shield coating (e.g., a thin metal coating deposited on the printed circuit to form an interference shielding layer). Initially, a printed circuit structure such as printed circuit structure 34 of FIG. 21 may be formed. Following formation of printed circuit 34, components 14 may be mounted on the upper and/or lower surfaces of printed circuit 34. Dielectric encapsulant such as thermoplastic or thermoset plastic such as encapsulant 106 may be formed on top of components 14 on the upper and lower surfaces of the printed circuit. Metal coating 108 may then be deposited on the opposing upper and lower surfaces of encapsulant 106 to form shielding for printed circuit 34 and components 14. Because embedded metal trace 104 (see, e.g., metal trace 104 of FIG. 21) is exposed along the edge of printed circuit 34, metal 108 is shorted to metal trace 104 at shorting location 110, thereby grounding the shielding formed from metal coating 108.

Figure 23:
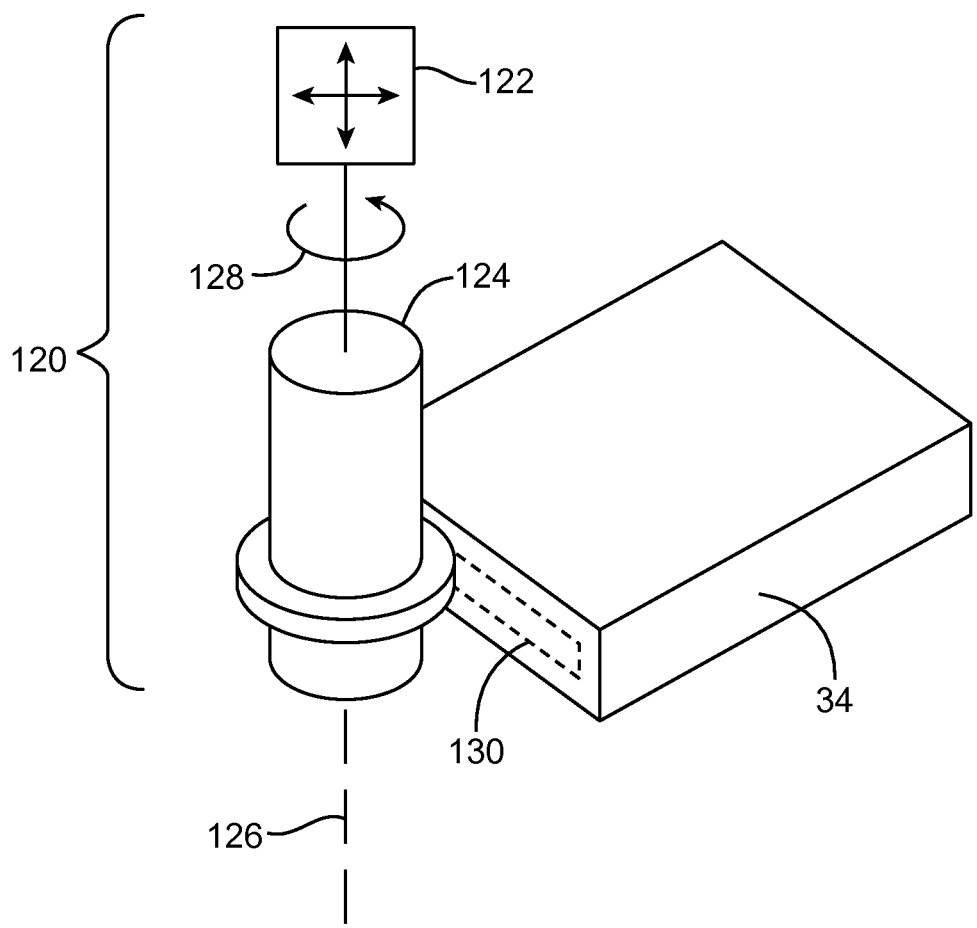
FIG. 23 is a perspective view of machining equipment being used to machine an edge of a printed circuit to form a groove while removing test pads in accordance with an embodiment.

If desired, a groove or other feature may be formed in the edge of printed circuit 34 to minimize the size of printed circuit 34 when removing a sacrificial extended test portion of the printed circuit following use of the extended test portion and pads on the extended test portion to perform tests on circuitry mounted on printed circuit 34. As shown in FIG. 23, for example, machining equipment 120 may have a computer-controlled positioner such as positioner 122, which can position routing bit 124 relative to printed circuit 34 and can rotate routing bit 124 in direction 128 about rotational axis 126. This causes routing bit 124 to remove the extended test portion of printed circuit 34 that is used to support test pads during testing and causes bit 124 to form a recess such as groove 130 in the edge of printed circuit 34, thereby recessing the traces in printed circuit 34 that were associated with carrying test signals.

Figure 24:
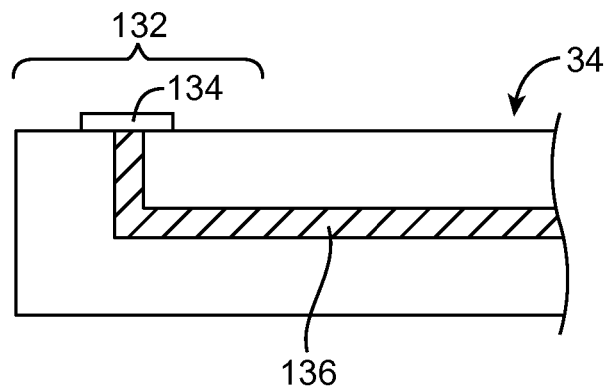
FIG. 24 is a cross-sectional side view of a printed circuit with a test pad in accordance with an embodiment.
Figure 25:
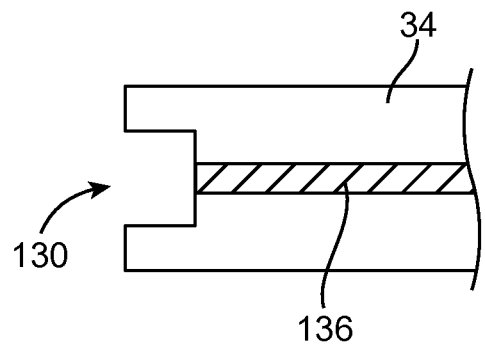
FIG. 25 is a cross-sectional side view of the printed circuit of FIG. 24 following routing of the edge of the printed circuit to remove the test pad and to recess test lines within a groove in the edge in accordance with an embodiment.
Figure 26:
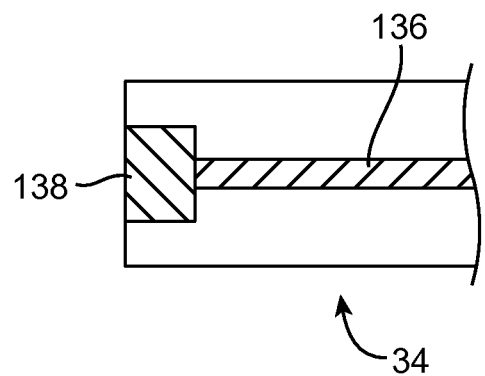
FIG. 26 is a cross-sectional side view of the printed circuit of FIG. 25 following incorporation of dielectric material into the edge groove of FIG. 25 in accordance with an embodiment.

FIGS. 24, 25, and 26 show how sacrificial test structures of this type may be used in testing circuitry on a printed circuit. Initially, as shown in FIG. 24, printed circuit 34 has extended test portion 132 with test pads 134 and metal traces 136 for interfacing with a tester such as tester 50 of FIG. 8. As shown in FIG. 25, following testing of circuitry on printed circuit 34, machining equipment such as machining equipment 120 of FIG. 23 may cut away extended test portion 132 and may form groove 130 in the end face of printed circuit 34. As a result, embedded traces in printed circuit 34 such as illustrative signal path 136 may be recessed within groove 130. As shown in FIG. 26, groove 130 may be filled with plastic or other dielectric 138 to isolate trace 136 during use of printed circuit 34 in a system.

Figure 27:
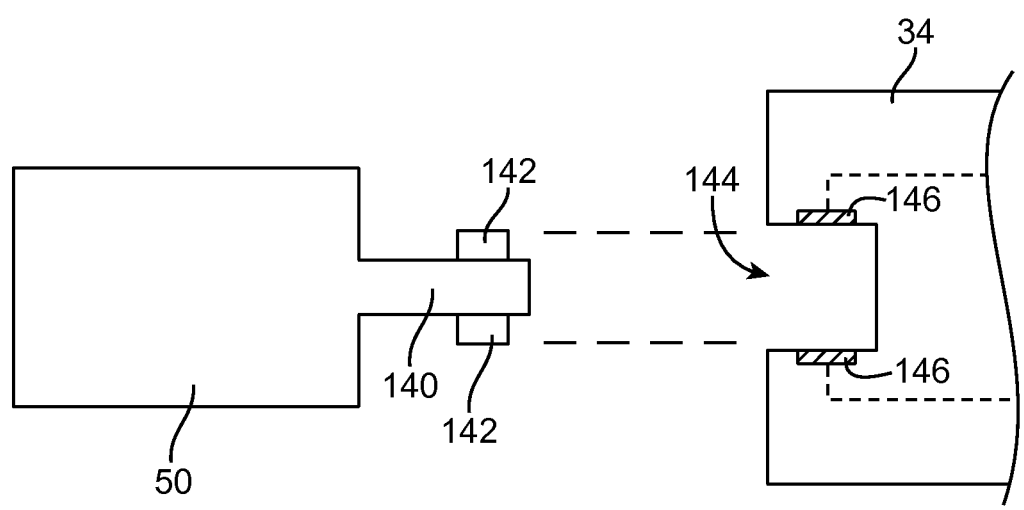
FIG. 27 is a cross-sectional side view of tester with a tongue-shaped external structure carrying contacts such as spring-loaded pins that are configured to mate with mating contacts in an opening in the edge of a printed circuit substrate in accordance with an embodiment.

FIG. 27 is a diagram showing how tester 50 may be provided with structures such as external structure 140 with spring-loaded contact pins 142. External structure 140 may be a printed circuit board, a plastic support member, a support member formed from other materials, or other suitable structure. Printed circuit 34 may have an opening such as opening 144. Printed circuit contacts 146 in opening 144 may be configured to mate with contacts such as spring-loaded pins 142 on tester structure 140 when structure 140 is inserted into opening 144. Following testing, opening 144 may be filled with plastic to isolate contacts 146.

Figure 28:
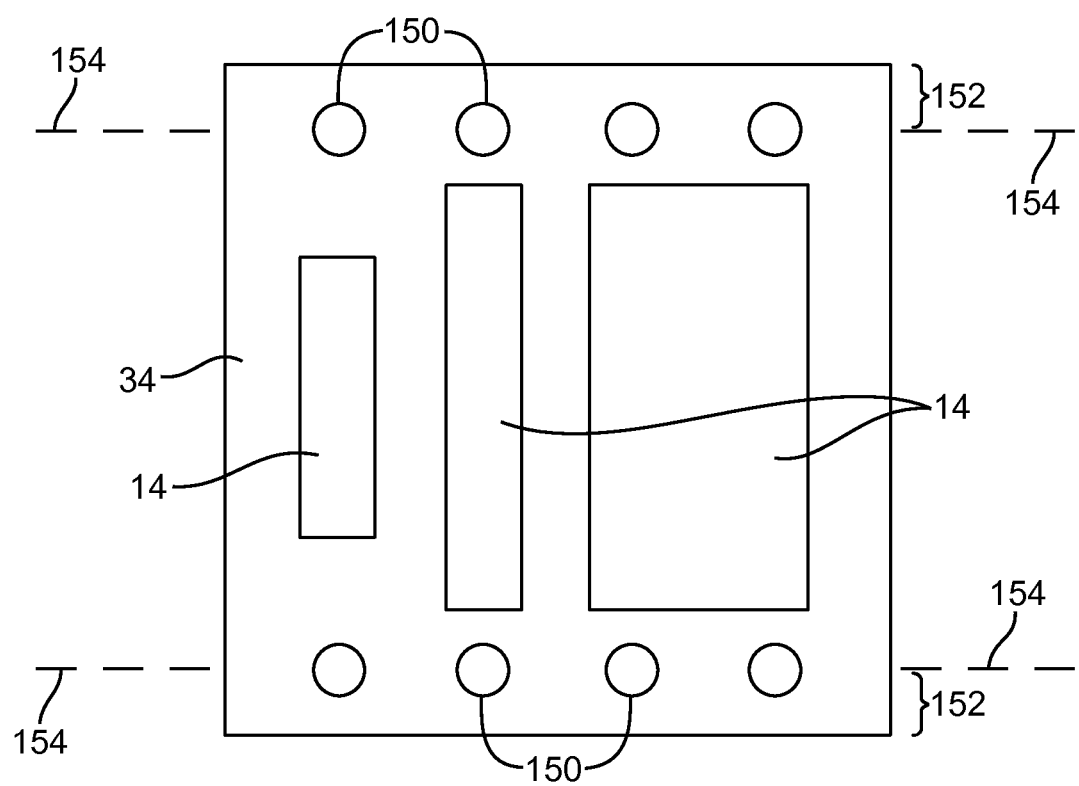
FIG. 28 is a top view of an illustrative printed circuit onto which components have been mounted in accordance with an embodiment.

FIG. 28 is a top view of an illustrative printed circuit with components 14 and sacrificial test portions. Contacts such as contacts 150 may be formed on printed circuit 34. Contacts 150 may, for example, be formed by creating conductive (metal-filled) vias in printed circuit 34. Extended test portions (sacrificial portions) 152 of printed circuit 34 may be cut away along lines 154. The cutting process cuts through the middle of contacts 150 and forms exposed contact surfaces along the cut edges of printed circuit 34.

Figure 29:
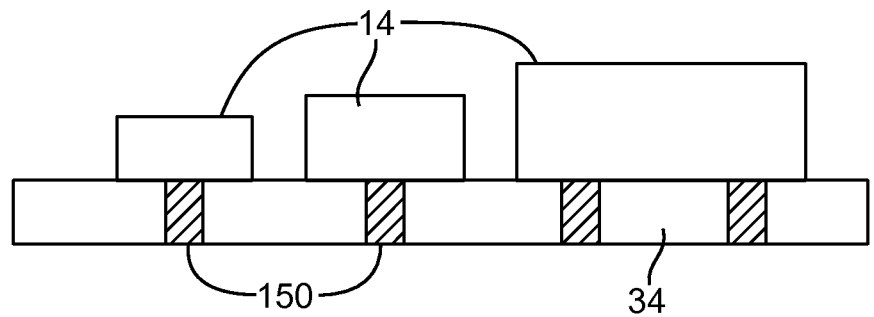
FIG. 29 is a side view of the printed circuit of FIG. 28 after portions of the printed circuit have been cut away to expose test points along the edges of the printed circuit in accordance with an embodiment.

FIG. 29 is a cross-sectional side view of printed circuit 34 of FIG. 28 taken along one of cut lines 154. As shown in FIG. 29, contacts 150 may have exposed surfaces on the edge of printed circuit 34. These exposed surfaces form edge portions of printed circuit contacts 150 and may therefore used as edge test points that can be probed by tester pins during testing. Tests may also be performed by using contacts 150 as test pads before cutting away portions 152 of printed circuit 34 to expose the edge surfaces of contacts 150, if desired.

Figure 30:
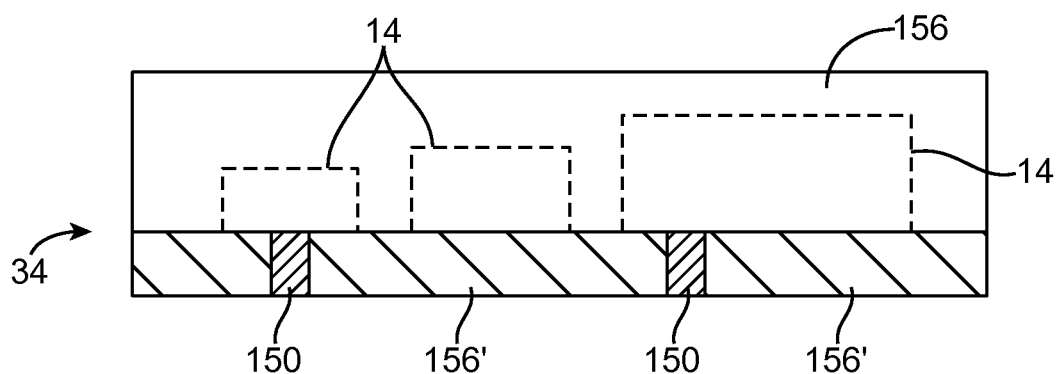
FIG. 30 is a side view of the printed circuit of FIG. 29 following formation of dielectric over mounted components on the printed circuit and following selective insulation of contacts on the edge of the printed circuit by covering some of the contacts on the edge with dielectric while leaving other contacts uncovered with dielectric in accordance with an embodiment.
Figure 31:
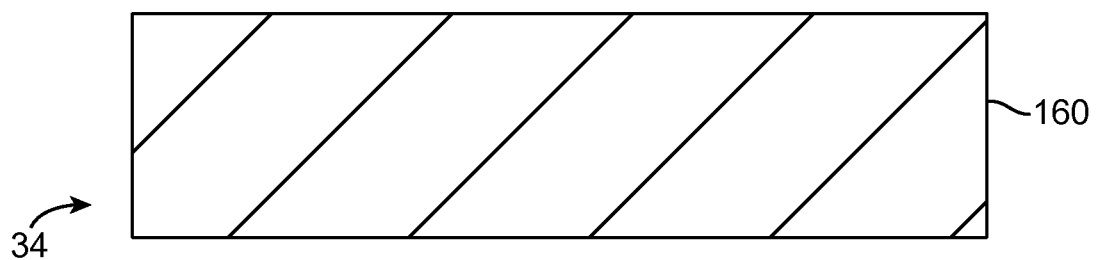
FIG. 31 is a side view of the printed circuit of FIG. 30 following the application of shielding material in accordance with an embodiment.

As shown in FIG. 29, encapsulant 156 may be used to cover components 14 as shown in FIG. 30. Contacts 150 may also be selectively covered with dielectric 156' (e.g., the material of encapsulant 156 or other material) along the edges of printed circuit 34. In the illustrative configuration of FIG. 30, for example, two of four contacts 150 have been covered in this way. With this configuration, two contacts (i.e., the first and third of the four illustrative contacts) have been left uncovered with dielectric and two contacts have been covered with dielectric 156'. The two contacts that are covered (and the uncovered contacts) may be used as edge test points during testing before the dielectric is applied. The two contacts that are left uncovered by dielectric 156' (i.e., the visible contacts 150 of FIG. 30) may be ground contacts (as an example). Following coating of printed circuit 34 of FIG. 30 with metal shielding 160, printed circuit 34 appears as shown in FIG. 31. Shielding layer 160 may be shorted to the contacts 150 that were not covered with dielectric 156' along the edge of printed circuit 34 (e.g., to ground shielding layer 160).

Figure 32:
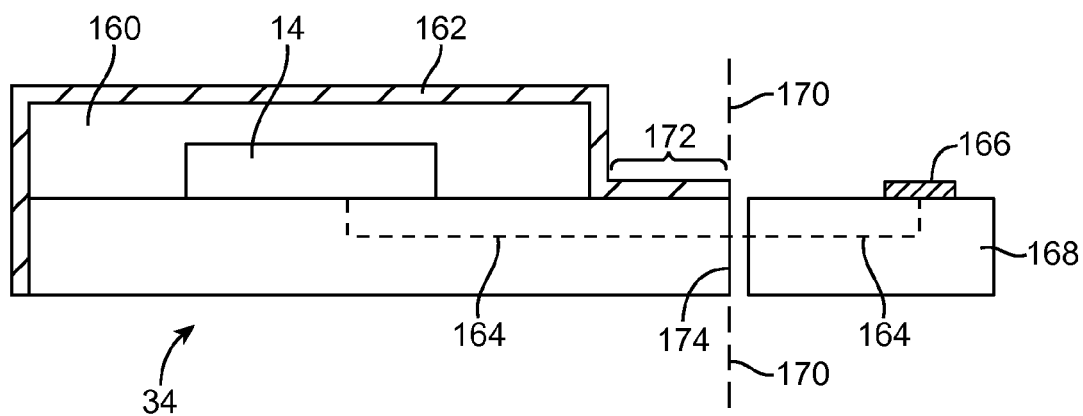
FIG. 32 is a cross-sectional side view of a printed circuit with traces that run under a shield layer on a portion of the surface of the printed circuit adjacent to an encapsulation layer in accordance with an embodiment.

Printed circuit 34 may have signal traces that run under a shielding layer. This type of configuration is shown in FIG. 32. As shown in FIG. 32, components 14 may be mounted on printed circuit substrate 34. Encapsulant 160 may be used to cover components 14. Printed circuit substrate 34 may have an upper surface on which components 14 are soldered. The encapsulant can cover components 14 and a portion of the upper surface, while leaving a portion of the upper surface such as portion 172 uncovered by encapsulant. After covering components 14 with encapsulant 160, metal shielding layer 162 may be formed on top of encapsulant 160. Part of metal layer 162 coats encapsulant 160 and part of metal layer 162 forms an integral planar ground on portion 172 of the upper surface of the dielectric substrate forming printed circuit 34. Printed circuit board signal traces 164 may run under planar ground portion 172 of shield 162. During testing, a tester can interface with components 14 using test pads 166 on extended test portion 168 of printed circuit 34. After testing is complete, portion 168 may be removed by cutting away portion 168 along cut line 170 (e.g., by cutting or grinding away portion 168). If desired, dielectric may be used to coat any exposed signal lines on exposed edge 174 following removal of portion 168 and additional shielding 162 may, if desired, be deposited.

FIGS. 33, 34, 35, 36, and 37 are cross-sectional side views showing how printed circuit 34 may be formed using openings through encapsulant layers. These openings, which may sometimes be referred to as vias or through-mold vias, may be used to access test pads, thereby allowing the size of printed circuit 34 to be minimized.

Figure 33:
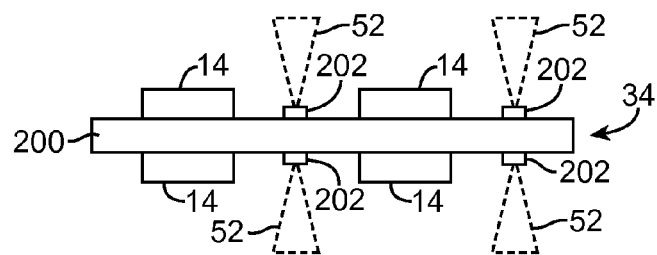
FIGS. 33, 34, 35, 36, and 37 are cross-sectional side views showing how a printed circuit may use through-mold vias to facilitate testing in accordance with an embodiment.

As shown in FIG. 33, printed circuit 34 may have a dielectric substrate such as substrate 200 on which one or more components 14 may be mounted. Printed circuit contacts such as test pads 202 may be used to form testing contact points that are contacted by respective test pins 52 in a tester.

Figure 34:
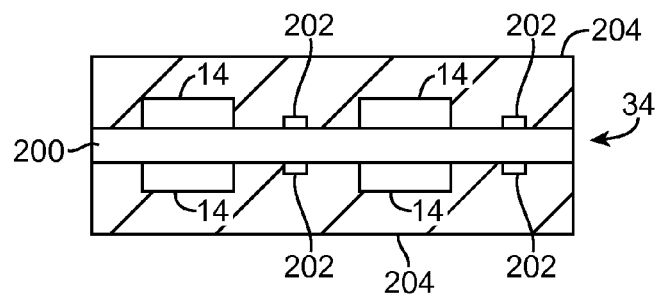

Following testing, encapsulant 204 may be used to cover components 14, as shown in FIG. 34. Encapsulant 204 may be a thermoplastic, a thermoset plastic, or other plastic.

Figure 35:
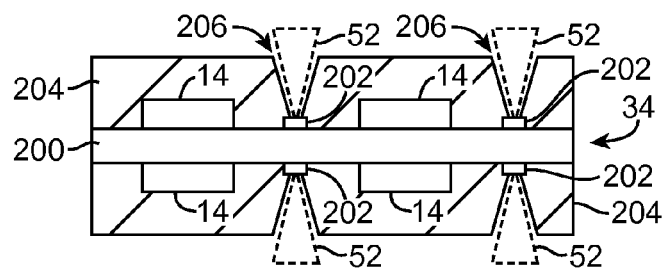

FIG. 35 shows how openings such as vias 206 may be formed through encapsulant 204 (e.g., using etching, using laser ablation, using machining techniques, as part of the molding process or other process involved in depositing encapsulant 204, etc.). Vias 206 uncover test pads 202. Test pins 52 may then contact the exposed surfaces of test pads 202 to perform optional testing.

Figure 36:
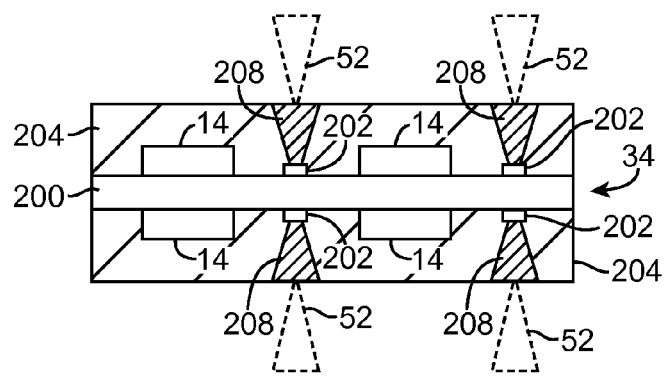

As shown in FIG. 36, the vias formed through encapsulant 204 may be filled with conductive material (e.g., metal, etc.) to form conductive vias. Additional optional testing may be performed by contacting the exposed outer surfaces of the conductive material of vias 208 with test pins 52.

Figure 37:
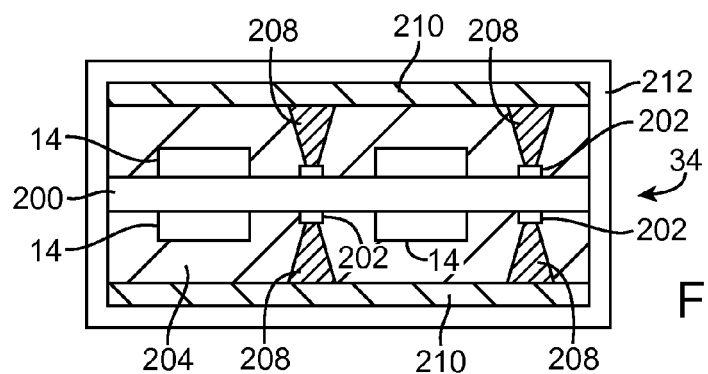

Dielectric layers 210 may then be used to cover and insulate conductive vias 208 and metal shielding layer 212 may then be deposited as a coating covering encapsulant 204 and the dielectric layers 210 on the upper and lower surfaces of printed circuit 34, as shown in FIG. 37.

Figure 38:
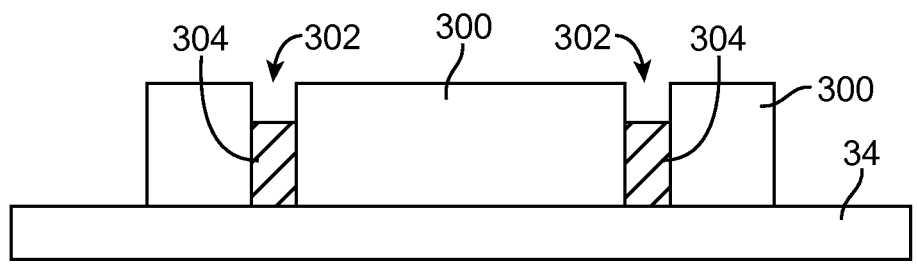
FIGS. 38, 39, and 40 are cross-sectional side views showing how a printed circuit may be provided with recessed test vias that pass through a dielectric layer that is used to encase components under a shield layer in accordance with an embodiment.
Figure 39:
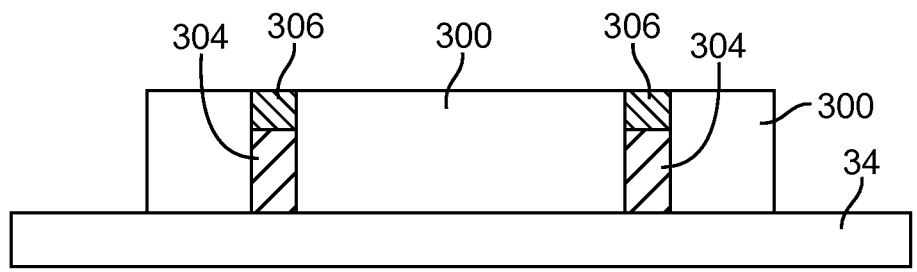
Figure 40:
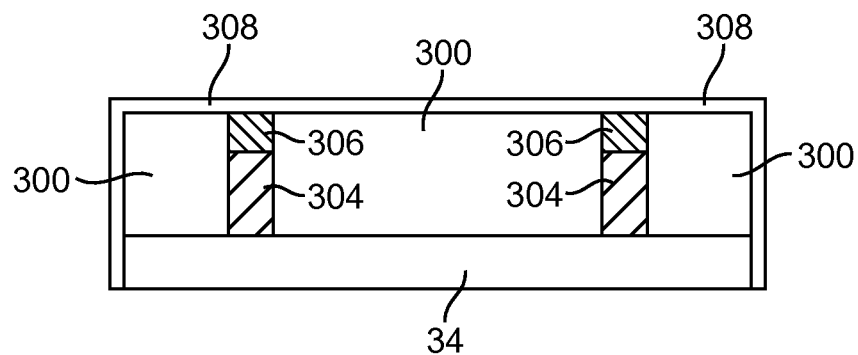

FIGS. 38, 39, and 40 show another through-mold via approach that may be used for testing printed circuit 34. Initially, as shown in FIG. 38, components on printed circuit 34 may be encapsulated using encapsulant 300, through mold-vias 302 may be formed, and conductive material may be formed in the through-mold vias to produce conductive vias 304. Conductive vias 304 may serve as printed circuit contacts (test points) on the surface of printed circuit 34 for testing the components on printed circuit 34 that are embedded within encapsulant 300. After the through mold vias are filled with conductive material, drilling, laser ablation techniques, or other techniques may be used to remove the upper portions of material 304, resulting in a configuration of the type shown in FIG. 38 in which conductive vias 304 are recessed with respect to the surface of encapsulant 300.

After testing the components on printed circuit 34 by contacting the surfaces of the conductive vias formed from material 304 of FIG. 38 with tester test pins, dielectric material 306 may be used to fill the upper portions of the openings in encapsulant 300 above conductive vias 304, thereby isolating conductive vias 304, as shown in FIG. 39.

FIG. 40 shows how metal coating 308 may then be deposited on encapsulant 300 to form a shielding layer on printed circuit 34. Because of the presence of dielectric plugs 306 at the top of the openings formed through encapsulant 300, metal coating 308 will not short conductive via structures 304 together during operation of printed circuit 34 in a system.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
    a printed circuit board comprising a plurality of printed circuit layers, wherein the printed circuit board has first and second opposing surfaces connected by an edge and at least two of the printed circuit layers are separated by a gap forming an opening along the edge of the printed circuit board;
    conductive traces in the printed circuit layers that form printed circuit contacts in the opening;
    an electrical component mounted directly to the first surface of the printed circuit board, wherein the printed circuit contacts in the opening are coupled to the electrical component by the conductive traces and are configured to mate with contacts on an external structure during testing; and
    dielectric in the opening that covers the printed circuit contacts in the opening after testing.

2. The apparatus defined in claim 1 wherein the conductive traces include ground traces that are exposed along the edge.

3. The apparatus defined in claim 2 further comprising encapsulant covering the electrical component.

4. The apparatus defined in claim 3 further comprising a metal coating on the encapsulant.

5. The apparatus defined in claim 4 wherein the metal coating is shorted to the ground traces that are exposed along the edge and forms an electromagnetic signal interference shield for the electrical component.

6. The apparatus defined in claim 5 wherein the printed circuit layers include at least a first layer on which the electrical component is soldered and at least a second layer, an additional electrical component is soldered to the second layer, the encapsulant includes portions that cover the additional electrical component, and the metal coating covers the encapsulant that covers the electrical component and encapsulant that covers the additional electrical component.

7. A method, comprising:
forming an embedded flex printed circuit having a rigid printed circuit board portion and a removable flexible printed circuit portion;
soldering an electrical component on the rigid printed circuit board portion;
with test pins in a tester, testing the electrical component on the rigid printed circuit board portion by probing test pads on the removable flexible printed circuit portion;
pulling the removable flexible printed circuit portion out of the rigid printed circuit board portion after testing the electrical components, wherein pulling the removable flexible printed circuit portion out of the rigid printed circuit board portion forms an opening between rigid printed circuit board dielectric layers in the rigid printed circuit board portion along an edge of the rigid printed circuit board portion and the rigid printed circuit board dielectric layers have printed circuit contacts in the opening that are configured to mate with corresponding contacts on the removable flexible printed circuit portion; and
filling the opening with dielectric to cover the printed circuit board contacts after pulling the removable flexible printed circuit portion out of the rigid printed circuit board portion.

8. Apparatus, comprising:
a printed circuit substrate with first and second opposing surfaces connected by an edge;
an electrical component soldered to the first surface of the substrate;
contacts on the edge of the printed circuit substrate, wherein exposed edge surfaces of the contacts are formed by cutting through the contacts to form the edge of the printed circuit substrate; and
dielectric covering a first of the contacts on the edge while leaving a second of the contacts on the edge uncovered with dielectric.

9. The apparatus defined in claim 8 further comprising encapsulant covering the electrical component.

10. The apparatus defined in claim 9 wherein the first of the contacts on the edge forms an edge test point and the second of the contacts on the edge comprises a ground contact.

11. The apparatus defined in claim 10 further comprising a metal shielding layer coating the encapsulant, wherein the metal shielding layer is isolated from the first of the contacts by the dielectric and is shorted to the second of the contacts along the edge.

12. Apparatus, comprising:
a printed circuit substrate;
electrical components mounted on the printed circuit substrate;
plastic encapsulant covering the electrical components;
test pads on the printed circuit substrate;
through-mold vias filled with conductive material to form conductive vias, wherein the conductive vias are shorted to the test pads;
dielectric covering the conductive vias; and
a metal shield coating that covers the plastic encapsulant and the dielectric.

13. The apparatus defined in claim 12 wherein the dielectric covers the conductive vias and portions of the plastic encapsulant.

14. The apparatus defined in claim 13 wherein the printed circuit substrate has opposing upper and lower surfaces, the electrical components comprise a first electrical component soldered to the upper surface and a second electrical component soldered to the lower surface, and the plastic encapsulant covers the first electrical component and the second electrical component.

15. The apparatus defined in claim 14 wherein the conductive vias include conductive vias on the upper surface and the lower surface and the dielectric comprises a first layer of dielectric that covers the conductive vias on the upper surface and a second layer of dielectric that covers the conductive vias on the lower surface.

16. A method of testing electrical components mounted on a printed circuit, wherein the printed circuit has first and second opposing surfaces connected by an edge, the edge has an opening with first and second opposing sides, a first contact is on the first side of the opening, and a second contact is on the second side of the opening, the method comprising:
contacting the first and second contacts in the opening with respective first and second spring-loaded pins on an external structure;
with a tester, testing the electrical components by conveying signals through the first and second contacts in the opening using the first and second spring-loaded pins on the external structure; and
following testing with the tester, removing the external structure from the opening.

17. The method defined in claim 16 wherein contacting the first and second contacts in the opening comprises inserting the external structure into the opening to align the first spring-loaded pin with the first contact and the second spring-loaded pin with the second contact.

18. The method defined in claim 16 further comprising:
filling the opening with dielectric after removing the external structure from the opening.

19. Apparatus, comprising:
a printed circuit substrate;
electrical components mounted on the printed circuit substrate;
plastic encapsulant covering the electrical components;
test pads on the printed circuit substrate;
through-mold vias filled with conductive material to form conductive vias, wherein the conductive vias are shorted to the test pads, the conductive vias are surrounded by and in direct contact with the plastic encapsulant, the conductive vias have an upper surface, and the plastic encapsulant has an upper surface that is coplanar with the upper surface of the conductive vias;
a planar dielectric layer that covers and directly contacts the upper surface of the conductive vias and the upper surface of the plastic encapsulant; and
a metal shield coating that covers the plastic encapsulant and the planar dielectric layer.

* * * * *